(12) United States Patent  
Wang (10) Patent No.: US 11,306,788 B2  
(45) Date of Patent: Apr. 19, 2022

(54) CARRYING DEVICE AND FIXING METHOD OF CARRYING DEVICE

(71) Applicant: WUHAN CHINA STAR OPTOELECTRONICS TECHNOLOGY CO., LTD., Hubei (CN)

(72) Inventor: Wei Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 437 days.

(21) Appl. No.: 16/470,566

(22) PCT Filed: Feb. 25, 2019

(86) PCT No.: PCT/CN2019/076081  
§ 371 (c)(1),  
(2) Date: Jun. 18, 2019

(87) PCT Pub. No.: WO2020/057058  
PCT Pub. Date: Mar. 26, 2020

(65) Prior Publication Data  
US 2021/0404522 A1 Dec. 30, 2021

(30) Foreign Application Priority Data  
Sep. 19, 2018 (CN) .......................... 201811118597.4

(51) Int. Cl.  
*F16D 63/00* (2006.01)  
*G03F 7/20* (2006.01)  
*F16D 121/20* (2012.01)

(52) U.S. Cl.  
CPC ....... *F16D 63/002* (2013.01); *G03F 7/70808* (2013.01); *F16D 2121/20* (2013.01)

(58) Field of Classification Search  
CPC . F16D 63/002; F16D 2121/20; G03F 7/70808  
See application file for complete search history.

(56) References Cited

U.S. PATENT DOCUMENTS 6,327,024 B1 * 12/2001 Hayashi .................. F16F 15/02  
355/53  
6,570,644 B2 * 5/2003 Binnard .............. G03F 7/70808  
355/53

(Continued)

FOREIGN PATENT DOCUMENTS

CN 102569155 A * 7/2012  
CN 102582670 A 7/2012

(Continued)

*Primary Examiner* — Pamela Rodriguez  
(74) *Attorney, Agent, or Firm* — Soroker Agmon Nordman (57) ABSTRACT

A carrying device and, a fixing method of a carrying device are provided. The carrying device includes a body and an electromagnet fixing module disposed on the body; wherein the electromagnet fixing module is configured to fix the carrying device. The present application uses the electromagnet fixing module to fix the carrying device, which can avoid downtime of an exposure machine caused by shaking of the carrying device when a robot arm of the exposure machine picks or places the mask form the carrying device so as to improve throughput.

12 Claims, 7 Drawing Sheets

(56) References Cited

U.S. PATENT DOCUMENTS

| | | | | |
|---|---|---|---|---|
| 7,826,155 | B2 * | 11/2010 | Geuppert | G03F 7/709 |
| | | | | 359/819 |
| 9,593,733 | B2 * | 3/2017 | Hauf | G03F 7/709 |
| 9,768,051 | B2 * | 9/2017 | Chen | H01L 21/68728 |
| 2004/0057817 | A1 | 3/2004 | Hazelton | |
| 2012/0138401 | A1 * | 6/2012 | Vogler | F16F 7/104 |
| | | | | 188/378 |

FOREIGN PATENT DOCUMENTS

| | | | |
|---|---|---|---|
| CN | 202616215 U | * | 12/2012 |
| CN | 204057086 U | | 12/2014 |
| CN | 104691816 A | | 6/2015 |
| CN | 204925616 U | * | 12/2015 |
| JP | 4853836 B2 | * | 1/2012 |

* cited by examiner

CARRYING DEVICE AND FIXING METHOD OF CARRYING DEVICE

FIELD OF INVENTION

The present invention relates to a field of display technologies, and more particularly, to a carrying device, and a fixing method of a carrying device.

BACKGROUND OF INVENTION

In the field of display panel manufacturing, photolithography is an indispensable core process, where photolithography usually includes processes, such as photoresist coating, exposing, developing, and etching. A mask is needed during the exposing process, and a transport equipment, such as a trolley, is needed to transport the mask to the internal of an exposure machine to perform the subsequent process.

Currently, when the transport equipment, such as a trolley, transports the mask to the internal of the exposure machine, the transport equipment is usually fixed by foot brakes to prevent shaking of the transport equipment when a robot arm of the exposure machine picks or places the mask from the transport equipment, such as the trolley. However, the internal ground of the exposure machine is made with an epoxy, and the levelness of the internal ground is inconsistent: such that the foot brakes of the transport equipment to be at a suspension state at different degrees. When the robot arm of the exposure machine picks or places the mask from the transport equipment, such as a trolley, if a tiny resist exists between the robot arm of the exposure machine and the transport equipment, such as a trolley, and the foot brake is at a suspension state, which results in a slight movement of the transport equipment, such as a trolley. The sensor cannot be sensed, which causes downtime of the exposure machine, and results in the loss of throughput.

Therefore, the prior art has drawbacks and seeds improvement urgently.

SUMMARY OF INVENTION

A carrying device is provided in the present application, and shaking of the carrying device is avoided by arranging an electromagnet fixing module on the carrying device.

In a first aspect, the present application provides a carrying device, including:

a body; and an electromagnet fixing module disposed on the body; wherein the electromagnet fixing module is configured to fix the carrying device.

In the carrying device provided by one embodiment of the present application, the electromagnet fixing module comprises a first electromagnet fixing sub-module disposed on one side of the body and a second electromagnet fixing sub-module disposed on another side of the body.

In the carrying device provided by one embodiment of the present application, the electromagnet fixing module comprises a first electromagnet fixing sub-module disposed on one side of the body and a second electromagnet fixing sub-module disposed on another side of the body.

In the carrying device provided by one embodiment of the present application, the first electromagnet fixing sub-module is disposed, opposite to the second electromagnet fixing sub-module.

In the carrying device provided by one embodiment of the present application, a first telescopic arm is disposed on one side of the body, a second telescopic arm is disposed on another side of the body, wherein the first telescopic arm is connected with the first electromagnet fixing sub-module, and the second telescopic arm is connected with the second electromagnet fixing sub-module.

In the carrying device provided by one embodiment of the present application, a first accommodation groove is formed on one side of the body, a second accommodation groove is formed on another side of the body, wherein the first accommodation groove is configured to accommodate the first telescopic arm and the first electromagnet fixing sub-module, and the second accommodation groove is configured to accommodate the second telescopic arm and the second electromagnet fixing sub-module.

In the carrying device provided by one embodiment of the present application, a telescopic length of the first telescopic arm is greater than a depth of the first accommodation groove, and a telescopic length of the second telescopic arm is greater than a depth of the second accommodation groove.

In the carrying device provided by one embodiment of the present application, the first electromagnet fixing sub-module is misaligned with the second electromagnet fixing sub-module.

In the carrying device provided by one embodiment of the present application, the electromagnet fixing module is fixed on the body by means of a screw connection.

In the carrying device provided by one embodiment of the present application, a power supply module is disposed on the body, the power supply module is configured to provide a voltage to the electromagnet fixing module, and to magnetize the electromagnet fixing module after power on.

In a second aspect, the present application further provides a fixing method of a carrying device for use in the carrying device provided by any one embodiment of the present application, including:

detecting whether a trigger operation on a preset button is received; and when the trigger operation on the preset button is received, powering on the electromagnet fixing module to magnetize the electromagnet fixing module to fix the carrying device.

In a third aspect, the application further provides a carrying device, including:

a body;

an electromagnet fixing module disposed on the body; wherein the electromagnet fixing module is configured to fix the carrying device, the electromagnet fixing module comprises a first electromagnet fixing sub-module disposed on one side of the body and a second electromagnet fixing sub-module disposed on another side of the body; and a power supply module configured to provide a voltage to the electromagnet fixing module, and to magnetize the electromagnet fixing module after power on.

In the carrying device provided by the embodiment of the present application, the first electromagnet fixing sub-module is disposed opposite to the second electromagnet fixing sub-module.

In the carrying device provided by the embodiment of the present application, a first telescopic arm is disposed on one side of the body, a second telescopic arm is disposed on another side of the body, wherein the first telescopic arm is connected with the first electromagnet fixing sub-module, and the second telescopic arm is connected with the second electromagnet fixing sub-module.

In the carrying device provided by the embodiment of the present application, a first accommodation groove is formed on one side of the body, a second, accommodation groove is formed on another side of the body, wherein the first accommodation groove is configured to accommodate the first telescopic arm and the first electromagnet fixing sub-module, and the second accommodation groove is configured to accommodate the second telescopic arm and the second electromagnet fixing sub-module.

In the carrying device provided by the embodiment of the present application, a telescopic length of the first telescopic arm is greater than a depth of the first accommodation groove, and a telescopic length of the second telescopic arm is greater than a depth of the second accommodation groove.

In the carrying device provided by the embodiment of the present application, the first electromagnet fixing sub-module is misaligned with the second electromagnet fixing sub-module.

In the carrying device provided by the embodiment of the present application, the electromagnet fixing module is fixed on the body by means of a screw connection.

The beneficial effect: the carrying device provided by the embodiment of the present application includes: a body; and an electromagnet fixing module disposed on the body; wherein the electromagnet fixing module is configured to fix the carrying device. The present application uses the electromagnet fixing module to fix the carrying device, which can avoid downtime of an exposure machine caused by shaking, of the carrying device when a robot arm of the exposure machine picks or places the mask from the carrying device so as to improvement throughput.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
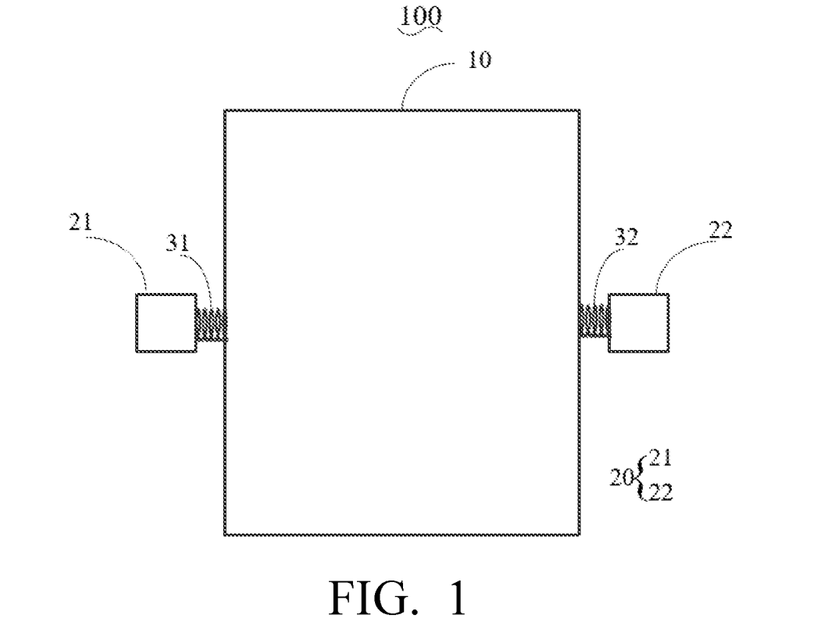
FIG. 1 is a first structural schematic diagram of a carrying device according to one embodiment of the present application.

Please refer to FIG. 1, FIG. 1 is a first structural schematic diagram of a carrying device according to one embodiment of the present application. The embodiment of the present application provides a carrying device 100, including: a body 10, and an electromagnet fixing module 20. The electromagnet fixing module 20 is disposed on the body 10. The electromagnet fixing module 20 is configured to fix the carrying device 10.

The embodiment of the present application provides with the electromagnet fixing module 20, when the carrying device 100 is moved to the designated position, powering on the electromagnet fixing module 20 in order to magnetize the electromagnet fixing module 20 to attach on other objects, so as to prevent the carrying device 100 from being shaken by external interference.

For example, the carrying device 100 may be configured to carry a mask and transport the mask to the internal of the exposure machine. The carrying device 100 includes a body 10 and an electromagnet fixing module 20 disposed on the body 10. The electromagnet fixing module 20 is configured to fix the carrying device 100. It should be noted that the embodiment of the present application is just one form of the carrying device 100, which may also be in other forms. The embodiment of the present application does not specifically limit the structure of the carrying device 100, which is subject to actual needs. The carrying device 100 in the embodiment of the present application is not only used for transporting the mask, but also for transporting other objects, and the use of the carrying device 100 is not specifically limited herein, which is subject to actual needs.

In some embodiments, the electromagnet fixing module 20 includes a first electromagnet fixing sub-module 21 disposed on one side of the body 10 of the carrying device 100 and a second electromagnet fixing sub-module 22 disposed on another side of the body 10. The first electromagnet fixing sub-module 21 is disposed opposite to the second electromagnet fixing sub-module 22.

Figure 2:
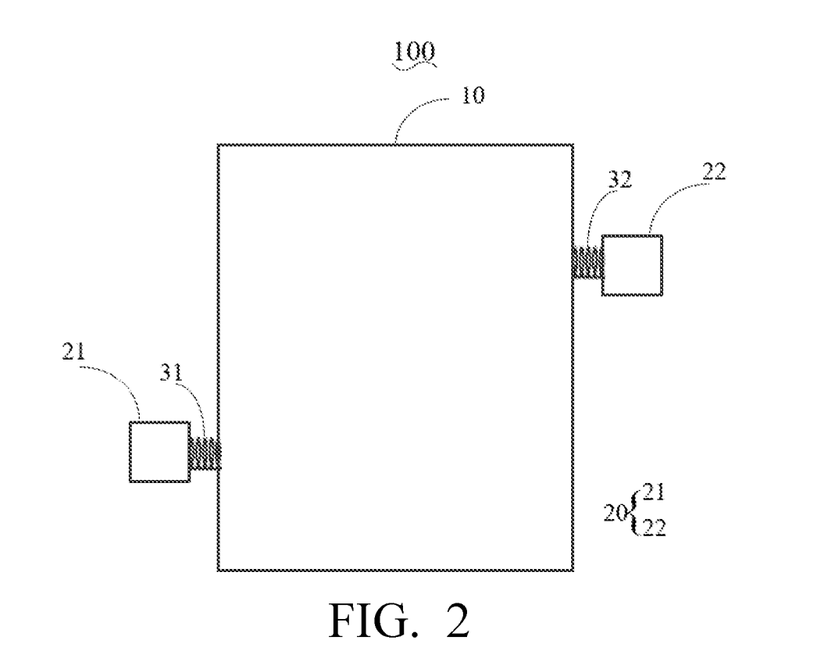
FIG. 2 is a second structural schematic diagram of the carrying device according to one embodiment of the present application.

In some embodiments, please refer to FIG. 2, FIG. 2 is a second structural schematic diagram of the carrying device according to one embodiment of the present application. The first electromagnet fixing sub-module 21 is misaligned with the second electromagnet fixing sub-module 22. For example, a first electromagnet fixing sub-module 21 and a second electromagnet fixing sub-module 22 may be disposed along the diagonal of the body 10.

Figure 3:
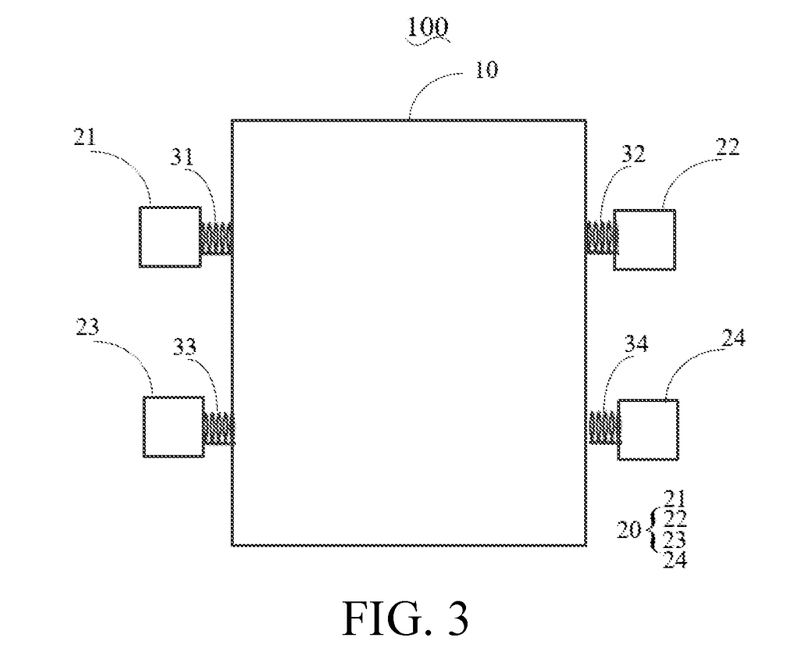
FIG. 3 is a third structural schematic diagram of the carrying device according to one embodiment of the present application.

Please refer to FIG. 3, FIG. 3 is a third structural schematic diagram of the carrying device according to one embodiment of the present application. The difference between the carrying device shown in FIG. 3 and the carrying, device shown in FIG. 1 is that the electromagnet fixing module 20 of the carrying device shown in FIG. 3 further includes a third electromagnet fixing sub-module 23 and a fourth electromagnet fixing sub-module 24, the third electromagnet fixing sub-module 23 is disposed on one side of the body 10, and the fourth electromagnet fixing sub-module 24 is disposed on another side of the body 10. The third electromagnet fixing sub-module 23 and the fourth electromagnet fixing sub-module 24 can be oppositely arranged. When the carrying device 100 is moved to the designated position, powering on the first electromagnet fixing sub-module 21, the second electromagnet fixing sub-module 22, the third electromagnet fixing sub-module 23, and the fourth electromagnet fixing sub-module 24 in order to magnetize the first electromagnet fixing sub-module 21, the second electromagnet fixing sub-module 22, the third electromagnet fixing sub-module 23, and the fourth electromagnet fixing sub-module 24 to attach on other objects. Therefore, the carrying device 100 may be fixed better, and it may prevent the carrying device 100 from being shaken by the external interference.

It should be noted that the above is only a few illustrations of the position and number of the electromagnet fixing module 20 disposed on the body 10 of the carrying device 100 provided by the embodiment of the present application, and those illustrations are not intended to limit the present application.

Figure 4:
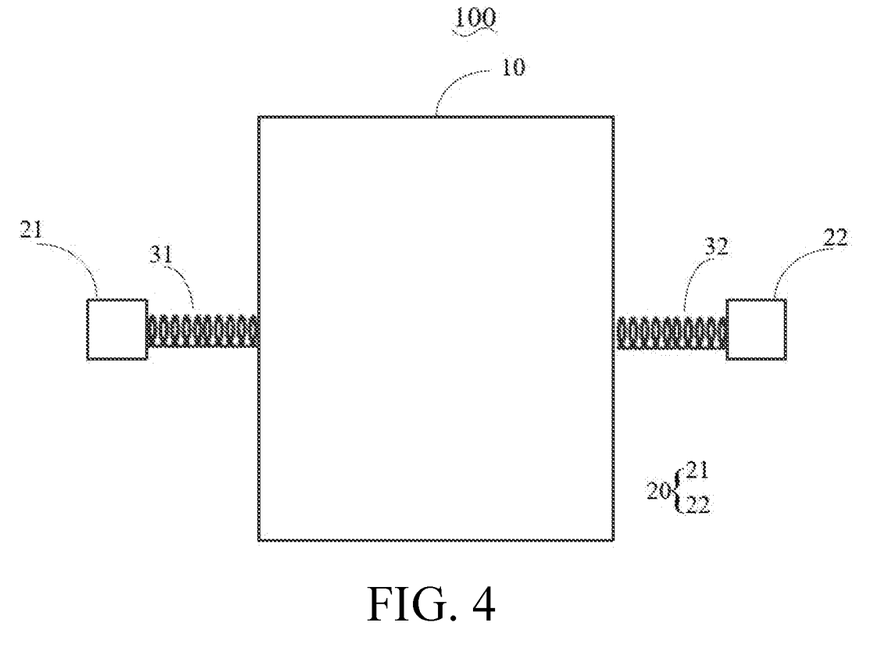
FIG. 4 is a schematic diagram of the carrying device shown in FIG. 1 in a fixed state.

Please refer to FIG. 4, FIG. 4 is a schematic diagram of the carrying device shown in FIG. 1 in a fixed state. A first telescopic arm 31 is disposed on one side of the body 10 of the carrying device 100, a second telescopic arm 32 is disposed on another side of the body 10 of the carrying device 100, wherein the first telescopic arm 31 is connected with the first electromagnet fixing sub-module 21, and the second telescopic arm 32 is connected with the second electromagnet fixing sub-module 21. That is, when it is necessary to fix the carrying device 100, powering on the first electromagnet fixing sub-module 21 and the second electromagnet fixing sub-module 22 in order to magnetize the first electromagnet fixing sub-module 21 and the second electromagnet fixing sub-module 22. Then the first telescopic arm 31 and the second telescopic arm 32 are extended, such that the first electromagnet fixing sub-module 21 and the second electromagnet fixing sub-module 22 may attach on other objects.

Figure 5:
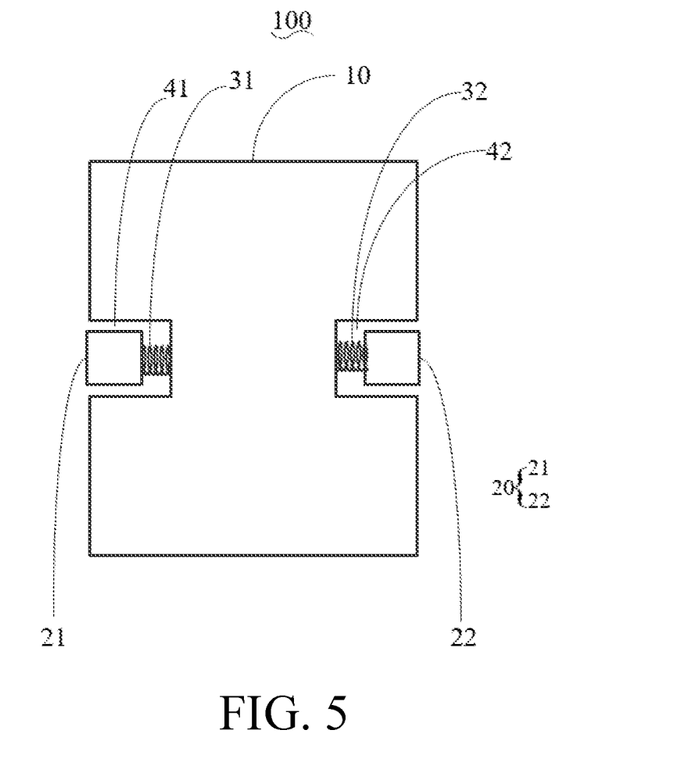
FIG. 5 is a fourth structural schematic diagram of the carrying device according to one embodiment of the present application.

Please refer to FIG. 5, FIG. 5 is a fourth structural schematic diagram of the carrying device according to one embodiment of the present application. A first accommodation groove 41 is formed on one side of the body 10 of the carrying device 100, a second accommodation groove 42 is formed on another side of the body 10 of the carrying device 100, wherein the first accommodation groove 41 is configured to accommodate the first telescopic arm 31 and the first electromagnet fixing sub-module 21, and the second accommodation groove 42 is configured to accommodate the second telescopic arm 32 and the second electromagnet fixing sub-module 22. It should be noted that a telescopic length of the first telescopic arm 31 is greater than a depth of the first accommodation groove 41, and a telescopic length of the second telescopic arm 32 is greater than a depth of the second accommodation groove 42. In the embodiment of the present application, the first telescopic arm 31 and the second telescopic arm 32 may be made of a retractable material, and the telescopic length refers to the length of the first telescopic arm 31 to be stretched and the length of the second telescopic arm 32 to be stretched, including but not limited to the limit length of the first telescopic arm 31 to be stretched and the limit length of the second telescopic arm 32 to be stretched.

Figure 6:
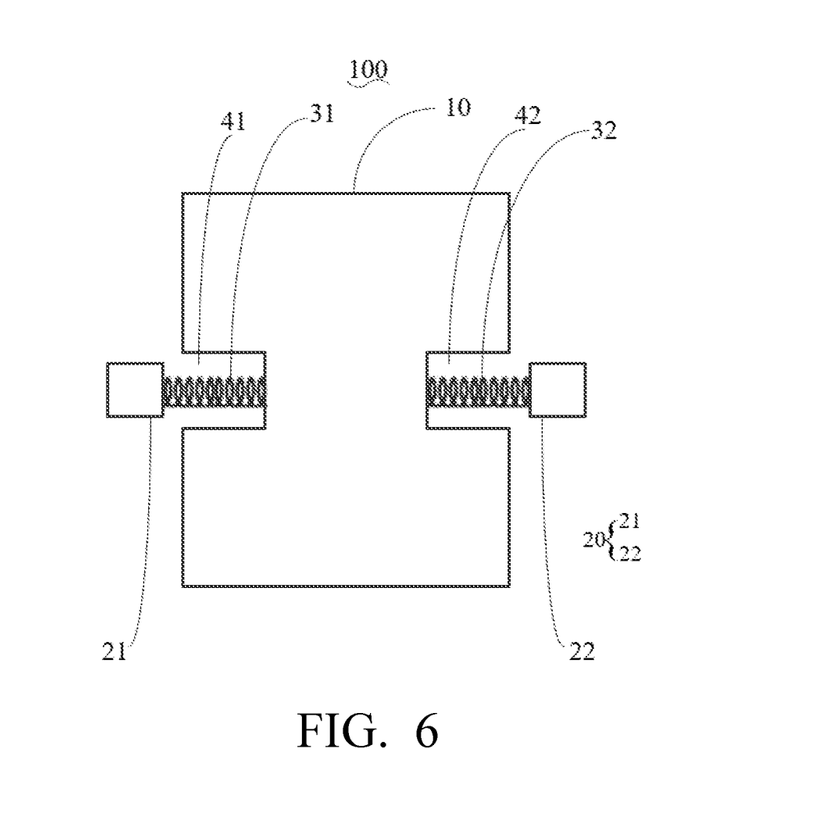
FIG. 6 is a schematic diagram of the carrying device shown in FIG. 5 in a fixed state.

Please refer to FIG. 6, FIG. 6 is a schematic diagram of the carrying device shown in FIG. 5 in a fixed state. When it is necessary to fix the carrying device 100, powering on the first electromagnet fixing sub-module 21 and the second electromagnet fixing sub-module 22 in order to magnetize the first electromagnet fixing sub-module 21 and the second electromagnet fixing sub-module 22. Then the first telescopic arm 31 and the second telescopic arm 32 are respectively extended form the first accommodation groove 41 and the second accommodation groove 42, such that the first electromagnet fixing sub-module 21 and the second electromagnet fixing sub-module 22 may attach on other objects.

Figure 7:
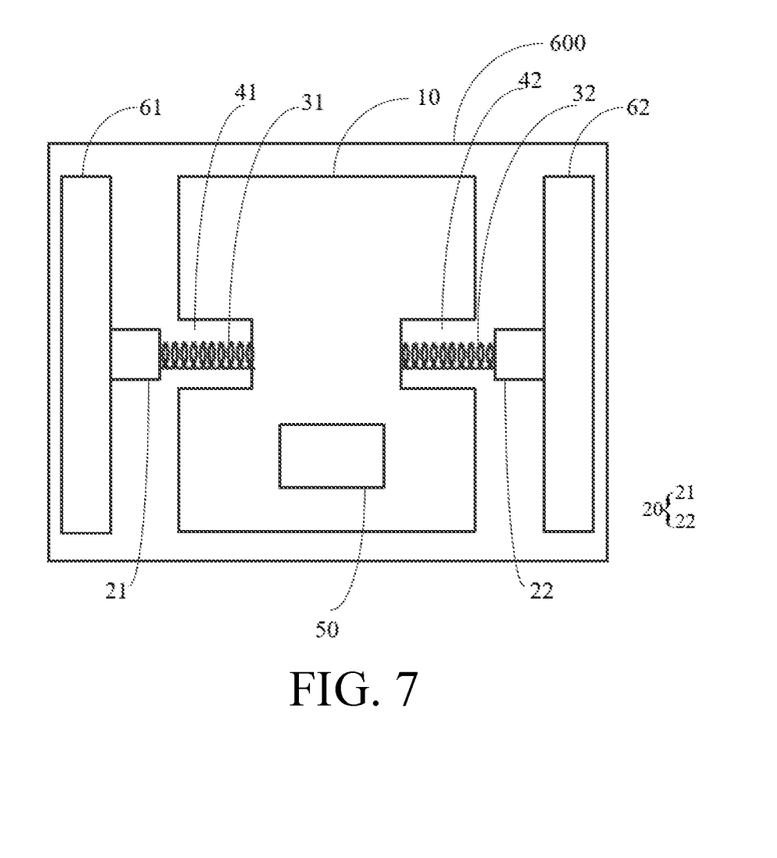
FIG. 7 is a schematic diagram of a scenario that a mask is transported to the internal of an exposure machine by the carrying device according to one embodiment of the present application.

Please refer to FIG. 7, FIG. 7 is a schematic diagram of a scenario that a mask is transported to the internal of an exposure machine by the carrying device according to one embodiment of the present application. A power supply module 50 is disposed on the body 10 of the carrying device 100, the power supply module 50 is configured to provide a voltage to the electromagnet fixing module 20, and to magnetize the electromagnet fixing module 20 after power on. That is, when the carrying device 100 carries the mask into the internal of the exposure machine 600, the power supply 50 provides voltage to the first electromagnet fixing sub-module 21 and the second electromagnet fixing sub-module 22, such that the first electromagnet fixing sub-module 21 and the second electromagnet fixing sub-module 22 are magnetized after power on. The first electromagnet fixing sub-module 21 can pull the first telescopic arm 31 from the first accommodation groove 41 to move toward a first guiding rail 61 of the exposure machine 600 and attach on the first guiding rail 61. The second electromagnet fixing sub-module 22 can pull the second telescopic arm 32 from the second accommodation groove 42 to move toward a second guiding rail 62 of the exposure machine 600 and attach on the first guiding rail 61, so as to fix the carrying device 100. This can avoid downtime of the exposure machine 600 caused by shaking of the carrying device 100 when the robot arm of the exposure machine 600 picks or places the mask from the carrying device 100.

When powering on the first electromagnet fixing sub-module 21 and the second electromagnet fixing sub-module 22, the first telescopic arm 31 and the second telescopic arm 32 are respectively pulled out from the first accommodation groove 41 and the second accommodation groove 42. When the first electromagnet fixing sub-module 21 and the second electromagnet fixing sub-module 22 attach on the other objects, the moving distance of the first electromagnet fixing sub-module 21 and the second electromagnet fixing sub-module 22 depend on the first electromagnet fixing sub-module 21, the second electromagnet fixing sub-module 22, and the position of the objects to be attached, and the moving distance is not specifically limited herein.

When the power supply module 50 stops providing voltage to the first electromagnet fixing sub-module 21 and the second electromagnet fixing sub-module 22 to power off the first electromagnet fixing sub-module 21 and the second electromagnet fixing sub-module 22, the first electromagnet fixing sub-module 21 and the second electromagnet fixing sub-module 22 no longer are magnetized, so that the first telescopic arm 31 and the second telescopic arm 32 no longer stretched. Since the first telescopic arm 31 and the second telescopic arm 32 are contractable, the first telescopic arm 31 and the second telescopic arm 32 will begin to contract. The first telescopic arm 31 and the second telescopic arm 32 respectively move the first electromagnet fixing sub-module 21 and the second electromagnet fixing sub-module 22 toward the first accommodation groove 41 and the second accommodating groove 42. Thus, the first electromagnet fixing sub-module 21 and the first telescopic arm 31 are housed in the first accommodation groove 41, and the second electromagnet fixing sub-module 22 and the second telescopic arm 32 are housed in the second accommodation groove 42.

When the electromagnet fixing sub-module 21 and the second electromagnet fixing sub-module 22 are powered off, the first electromagnet fixing sub-module 21 and the first telescopic arm 31 are housed in the first accommodation groove 41, and the second electromagnet fixing sub-module 22 and the second telescopic arm 32 are housed in the second accommodation groove 42, which does not affect the aesthetics of the carrying device. Moreover, if the internal of the exposure machine 600 may accommodate the carrying device, the first electromagnet fixing sub-module 21 and the second electromagnet fixing sub-module 22 may respectively be attached on the first guiding rail 61 and the second guiding rail 62 of the exposure machine 600 after power on.

Figure 8:
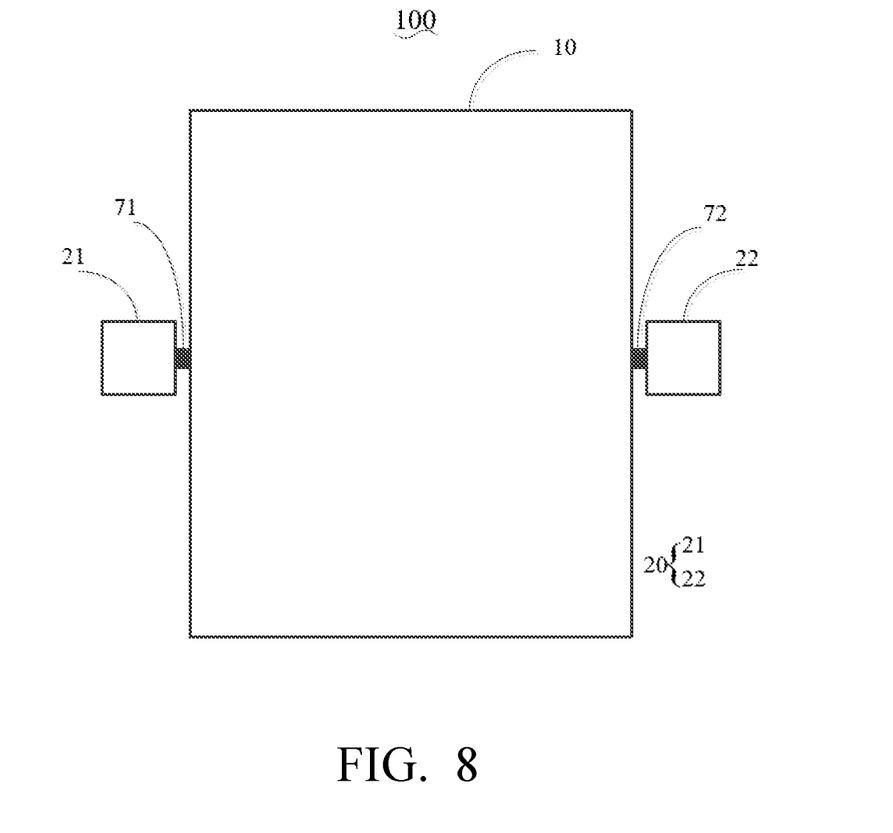
FIG. 8 is a fifth structural schematic diagram of the carrying device according to one embodiment of the present application.

Please refer to FIG. 8, FIG. 8 is a fifth structural schematic diagram of the carrying device according to one embodiment of the present application. The embodiment of the present application provides a carrying device 100, including: a body 10 and an electromagnet fixing module 20. The electromagnet fixing module 20 is disposed on the body 10. The electromagnet fixing module 20 is configured to fix the carrying device 100. The electromagnet fixing module 20 is fixed on the body 10 by means of a screw connection.

The electromagnet fixing module 20 may be divided into a first electromagnet fixing sub-module 21 and a second electromagnet fixing sub-module 22. The first electromagnet fixing sub-module 21 is fixed on the body 10 by a first screw thread 71, and the second electromagnet fixing sub-module 22 is fixed on the body 10 by a second screw thread 72. The screw connection is a detachable connection, which has the advantages of simple structure, reliable connection, convenient assembly and disassembly, and the like. In this embodiment, the electromagnet fixing module 20 is fixed on the body 10 by means of the screw connection, and the electromagnet fixing module 20 may be removed and cleaned at any time, thereby greatly improving the usability of the electromagnet fixing module 20.

Figure 9:
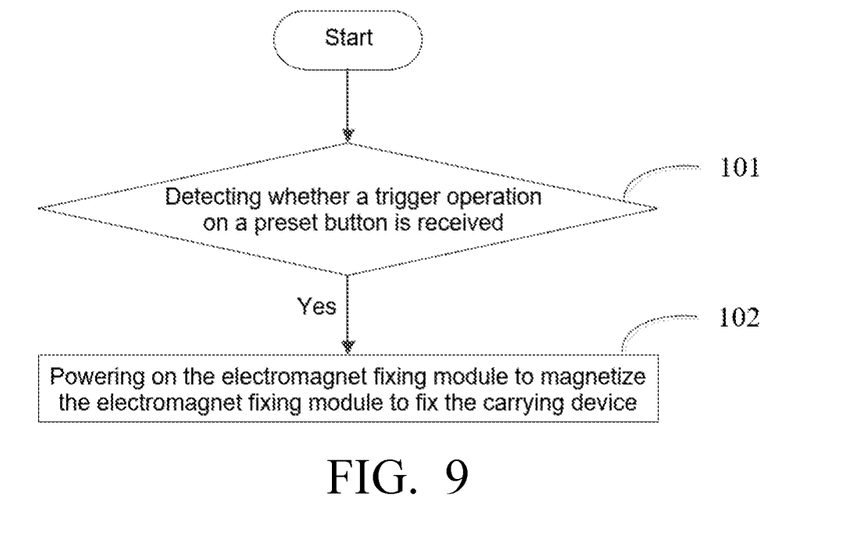
FIG. 9 is a schematic flowchart of a fixing method of a carrying device according to one embodiment of the present application.

Please refer to FIG. 9, FIG. 9 is a schematic flowchart of a fixing method of a carrying device according to one embodiment of the present application. The embodiment of the present application further provides a fixing method of a carrying device for use in the carrying device 100 provided by the above embodiment, including:

Step 101, detecting whether a trigger operation on a preset button is received.

Step 102, when the trigger operation on the preset button is received, powering on the electromagnet fixing module to magnetize the electromagnet fixing module to fix the carrying device.

Figure 10:
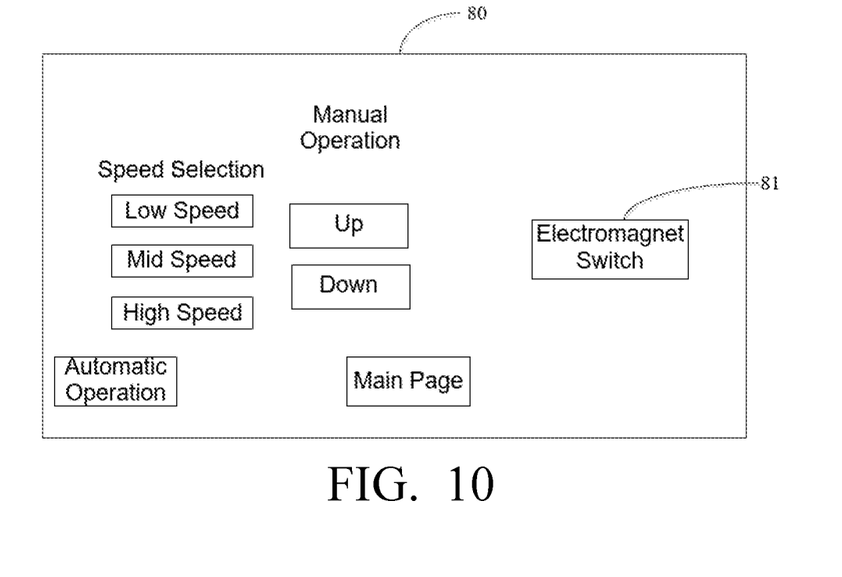
FIG. 10 is a schematic diagram of a scenario that is an operation interface of the carrying device according to one embodiment of the present application.

Please refer to FIG. 10, FIG. 10 is a schematic diagram of a scenario that is an operation interface of the carrying device according to one embodiment of the present application. A carrying device 100 in this embodiment further includes a display screen, the display screen may display an operation interface 80 of the carrying device 100. An electromagnet switch button 81 may be disposed on the operation interface 80, When a user clicks on the electromagnet switch button 81, the carrying device 100 receives a trigger operation on the electromagnet switch button 81. When the carrying device 100 receives the trigger operation on the electromagnet switch button 81, the electromagnet fixing module 20 can be powered on. After power on, the electromagnet fixing module 20 is magnetized to attach on the guiding rail on both sides of the exposure machine, thereby the carrying device 100 is fixed. This can avoid downtime of the exposure machine caused by shaking of the carrying device 100 when a robot arm of the exposure machine picks or places the mask from the carrying device 100.

The embodiment of the present application further provides a carrying device, including:

a body;

an electromagnet fixing module disposed on the body; wherein the electromagnet fixing module is configured to fix the carrying device, the electromagnet fixing module comprises a first electromagnet fixing sub-module disposed on one side of the body and a second electromagnet fixing sub-module disposed on another side of the body; and a power supply module configured to provide a voltage to the electromagnet fixing module, and to magnetize the electromagnet fixing module after power on.

Wherein, the first electromagnet fixing sub-module is disposed opposite to the second electromagnet fixing sub-module.

Wherein, a first telescopic arm is disposed on one side of the body, a second telescopic arm is disposed on another side of, the body, wherein the first telescopic arm is connected with the first electromagnet fixing sub-module, and the second telescopic arm is connected with the second electromagnet fixing sub-module.

Wherein, a first accommodation groove is formed on one side of the body, a second accommodation groove is formed on another side of the body, wherein the first accommodation groove is configured to accommodate the first telescopic arm and the first electromagnet fixing sub-module, and the second accommodation groove is configured to accommodate the second telescopic arm and the second electromagnet fixing sub-module.

Wherein, a telescopic length of the first telescopic arm is greater than a depth of the first accommodation groove, and a telescopic length of the second telescopic arm is greater than a depth of the second accommodation groove.

Wherein, the first electromagnet fixing sub-module is misaligned with the second electromagnet fixing sub-module.

Wherein, the electromagnet fixing module is fixed on the body by means of a screw connection.

The carrying device and the fixing method of the carrying device are described in detail above. The principles and embodiments of the present application are set forth in the specific examples, and the description of the above embodiments is only for the purpose of understanding the present application. In the meantime, those skilled in the art will be able to change the specific embodiments and the scope of the application according to the idea of the present application. In the above, the content of the specification should not be construed as limiting the present application.

What is claimed is:

1. A carrying device, comprising:
    a body; and
    an electromagnet fixing module disposed on the body;
        wherein the electromagnet fixing module is configured to fix the carrying device, the electromagnet fixing module comprises to first electromagnet fixing sub-module disposed on one side of the body and a second electromagnet fixing sub-module disposed on another side of the body, and the first electromagnet fixing sub-module is disposed opposite to the second electromagnet fixing sub-module: and
    wherein a first telescopic arm is disposed on one side of the body, a second telescopic arm is disposed on another side of the body, wherein the first telescopic arm is connected with the first electromagnet fixing sub-module, and the second telescopic arm is connected with the second electromagnet fixing sub-module.

2. The carrying device according to claim 1, wherein a first accommodation groove is formed on one side of the body, a second accommodation groove is formed on another side of the body, wherein the first accommodation groove is configured to accommodate the first telescopic arm and the first electromagnet fixing, sub-module, and the second accommodation groove is configured to accommodate the second telescopic arm and the second electromagnet fixing sub-module.

3. The carrying device according to claim 2, wherein a telescopic length of the first telescopic arm is greater than a depth of the first accommodation groove, and a telescopic length of the second telescopic arm is greater than a depth of the second accommodation groove.

4. The carrying device according to claim 1, wherein the first electromagnet fixing sub-module is misaligned with the second electromagnet fixing sub-module.

5. The carrying device according to claim 1, wherein the electromagnet fixing module is fixed on the body by means of a screw connection.

6. The carrying device according to claim 1, wherein a power supply module is disposed on the body, the power supply module is configured to provide a voltage to the electromagnet fixing module, and to magnetize the electromagnet fixing module after power on.

7. A fixing method of a carrying device for use in the carrying device according to claim 1, comprising:
- detecting whether a trigger operation on a preset button is received; and
- when the trigger operation on the preset button is received, powering on the electromagnet fixing module to magnetize the electromagnet fixing module to fix the carrying device.

8. A carrying device, comprising:
- a body;
- an electromagnet fixing module disposed on the body; wherein the electromagnet fixing module is configured to fix the carrying device, the electromagnet fixing module comprises a first electromagnet fixing sub-module disposed on one side of the body and a second electromagnet fixing sub-module disposed on another side of the body and the first electromagnet fixing sub-module is disposed opposite to the second electromagnet fixing sub-module;
- wherein a first telescopic arm is disposed on one side of the body, a second telescopic arm is disposed on another side of the body, wherein the first telescopic arm is connected with the first electromagnet fixing sub-module, and the second telescopic arm is connected with the second electromagnet fixing sub-module; and
- a power supply module configured to provide a voltage to the electromagnet fixing module, and to magnetize the electromagnet fixing module after power on.

9. The carrying device according to claim 8, wherein a first accommodate groove is formed on one side of the body, a second accommodation groove is formed on another side of the body, wherein the first accommodation groove is configured to accommodate the first telescopic arm and the first electromagnet fixing sub-module, and the second accommodation groove is configured to accommodate the second telescopic arm and the second electromagnet fixing sub-module.

10. The carrying device according to claim 9, wherein a telescopic length of the first telescopic arm is greater than a depth of the first accommodation groove, and a telescopic length of the second telescopic arm is greater than a depth of the second accommodation groove.

11. The carrying device according to claim 8, wherein the first electromagnet fixing sub-module is misaligned with the second electromagnet fixing sub-module.

12. The carrying device according to claim 8, wherein the electromagnet fixing module is fixed on the body by means of a screw connection.

* * * * *